(12) United States Patent
Wang et al.

(10) Patent No.: US 7,909,476 B2
(45) Date of Patent: Mar. 22, 2011

(54) LIGHT SOURCE MODULE OF LIGHT EMITTING DIODE

(75) Inventors: Chun-Wei Wang, Miao-Li Hsien (TW); Hung-Kuang Hsu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 114 days.

(21) Appl. No.: 12/192,382

(22) Filed: Aug. 15, 2008

(65) Prior Publication Data
US 2009/0190325 A1  Jul. 30, 2009

(30) Foreign Application Priority Data
Jan. 24, 2008 (CN) .......................... 2008 1 0300209

(51) Int. Cl.
*F21V 9/16* (2006.01)

(52) U.S. Cl. ........................ 362/84; 362/260; 362/97.3

(58) Field of Classification Search .................. 362/84, 362/260, 250, 97.3
See application file for complete search history.

(56) References Cited

U.S. PATENT DOCUMENTS

| | | | | |
|---|---|---|---|---|
| 4,095,144 A * | 6/1978 | Mendelsohn | ................ | 315/375 |
| 7,025,651 B2 * | 4/2006 | Song et al. | ..................... | 445/50 |
| 7,278,756 B2 * | 10/2007 | Leu et al. | ..................... | 362/260 |
| 7,531,960 B2 * | 5/2009 | Shimizu et al. | ............... | 313/512 |
| 7,710,016 B2 * | 5/2010 | Miki et al. | ..................... | 313/502 |
| 2005/0052871 A1 * | 3/2005 | Leu et al. | ..................... | 362/311 |
| 2008/0037252 A1 * | 2/2008 | Nii et al. | ..................... | 362/267 |
| 2008/0080165 A1 * | 4/2008 | Kim et al. | ..................... | 362/84 |

FOREIGN PATENT DOCUMENTS

| | | |
|---|---|---|
| CN | 1630107 A | 6/2005 |
| WO | 2005/067068 A1 | 7/2005 |

* cited by examiner

*Primary Examiner* — Evan Dzierzynski
(74) *Attorney, Agent, or Firm* — Andrew C. Cheng

(57) ABSTRACT

A light source module of light emitting diode includes a substrate having circuits, a light-converted component, and several of light emitting diodes. The light-converted component includes a transparent substrate and a fluorescence material layer positioned on the transparent substrate. The fluorescence material layer is divided into a central region and several of surrounding regions surrounding the central region. The central region has a greatest concentration of fluorescence material. The concentration of fluorescence material in the surrounding regions decreases from the center to the outer periphery of the fluorescence material layer. The light emitting diodes form an array and are positioned on the substrate between the substrate and the fluorescence material layer. Each of the light emitting diodes is electrically connected to the circuits.

20 Claims, 6 Drawing Sheets

LIGHT SOURCE MODULE OF LIGHT EMITTING DIODE

BACKGROUND

1. Field of the Invention

The present invention generally relates to light source modules and particularly, to a light source module of light emitting diodes which generates white lights.

2. Description of Related Art

Light emitting diodes (LEDs) have excellent characteristics, for example, small volume, good optical properties, low energy consumption, and long lifespan, which make them very suitable for use in illumination devices. With the improvement of light emitting efficiency, LEDs are widely employed as light source for illumination.

A typical light source module uses a blue LED as an initial light source to produce a white light. The blue light emitted from the blue LED strikes fluorescence material within the light source module to generate a yellow secondary color light. The combination of the yellow and residual blue lights produces a white light. However, if a proportion of the residual blue light to the yellow light in one lumen of the white light increases, the white lights have a blue color bias. Conversely, if the proportion decreases, the white lights have a yellow color bias.

A light source module generally includes an array of LEDs that form a small area of a light source. Initial lights emitted from each of the LEDs are diffused. The intensity of the initial lights emitted from a LED gradually reduces from the center to the periphery of the LED. Thus, the intensity of the initial lights emitted from the small area of light source gradually reduces from the center to the periphery of the module. White lights emitted from the module bias the color of the initial lights near the center of the module, and bias the color of the lights fluoresced from fluorescence materials near the periphery of the module. As a result, the color of the white lights is not evenly distributed.

Therefore, a new light source module is desired in order to overcome the above-described shortcoming.

SUMMARY

An exemplary embodiment of the present invention provides a light source module of light emitting diode including a substrate having circuits, a light-converted component, and a plurality of light emitting diodes. The light-converted component includes a transparent substrate and a fluorescence material layer positioned on the transparent substrate. The fluorescence material layer defines a central region and a plurality of surrounding regions surrounding the central region. The central region has a greatest concentration of fluorescence material. The concentration of fluorescence material in the plurality of surrounding regions decreases from the center to the outer periphery of the fluorescence material layer. The light emitting diodes form an array and are positioned on the substrate between the substrate and the fluorescence material layer. Each of the light emitting diodes is electrically connected to the circuits.

Other advantages and novel features will become more apparent from the following detailed description when taken in conjunction with the accompanying drawings.

BRIEF DESCRIPTION OF THE DRAWINGS

Many aspects of the light source module of LED can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION OF THE EMBODIMENTS

Figure 1:
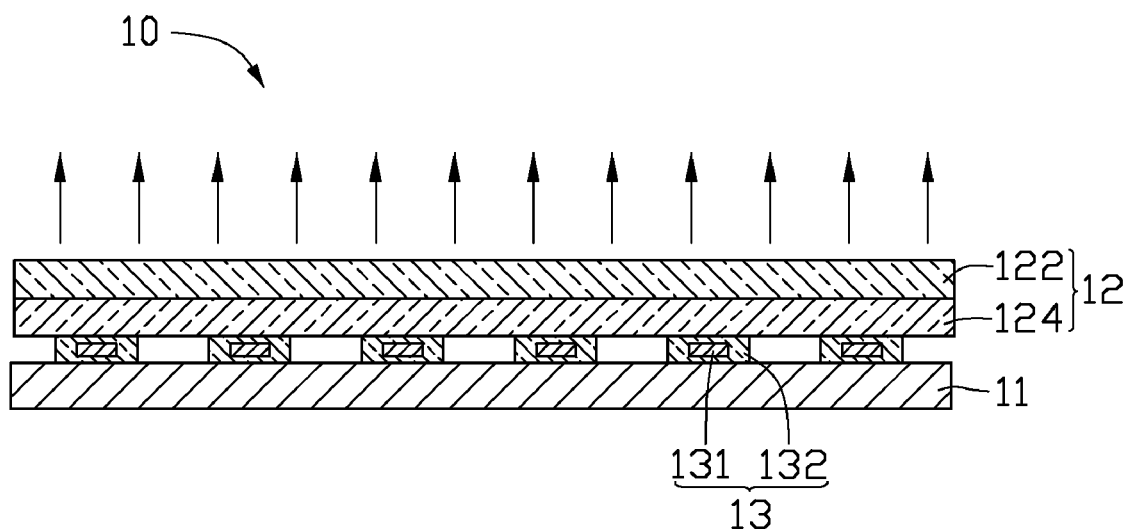
FIG. 1 is a cross-sectional view of a first embodiment of a light source module, the light source module including a light-converted component.

Referring to FIG. 1, a first embodiment of a light source module 10 includes a substrate 11, a light-converted component 12, and a plurality of LEDs 13 positioned between the substrate 11 and the light-converted component 12.

The substrate 11 is a printed circuit board (PCB) such as a flame retardant woven glass reinforced epoxy resin (FR4) PCB, a metal core PCB (MCPCB), a ceramic PCB, and a silicon PCB. The substrate 11 includes metal circuits (not shown).

The LEDs 13 form an array (no labeled) and are electrically connected to the metal circuits of the substrate 11. Each LED 13 includes an LED chip 131 and a packaging component 132 that packages the LED chip 131. The LEDs 13 are packaged blue LEDs configured for emitting blue lights. The wavelength of the blue light is generally in the range from 430 nanometers to 470 nanometers.

The light-converted component 12 includes a transparent substrate 122 and a fluorescence material layer 124 coated on a surface of the transparent substrate 122 adjacent to the LEDs 13. The fluorescence material layer 124 is divided into a central region and a plurality of surrounding regions surrounding the central region. The central region has a greatest concentration of fluorescence material. Each surrounding region has a different concentration of fluorescence material. The concentration of fluorescence material in the plurality of surrounding regions decreases from the center to the outer periphery of the fluorescence material layer 124.

Figure 2:
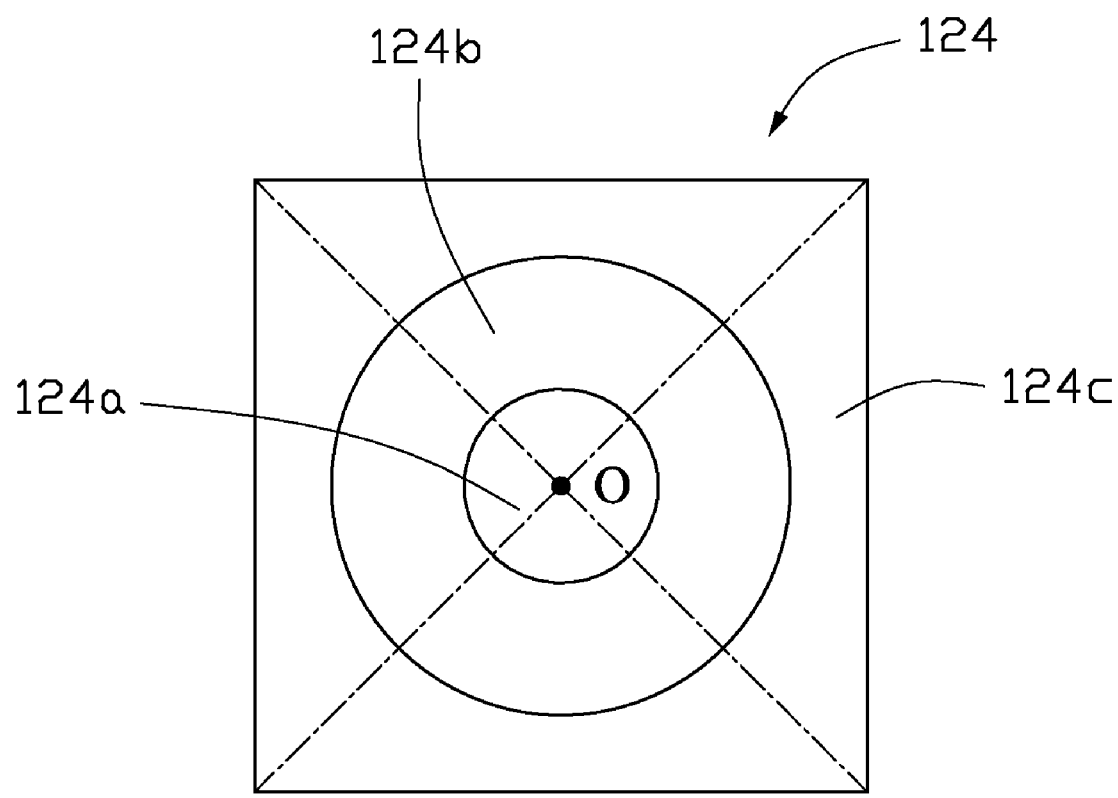
FIG. 2 is a schematic view of one embodiment of a light-converted component of the light source module of FIG. 1.

Referring to FIG. 2, one embodiment of the fluorescence material layer 124 is divided, for exemplary purposes, into a first region 124a having a concentration α1 of fluorescence material, a second region 124b surrounding the first region 124a and having a concentration α2 of fluorescence material, and a third region 124c surrounding the second region 124b and having a concentration α3 of fluorescence material. In the embodiment of FIG. 2, the boundaries between the surrounding regions are circular in shape and surround the center O.

Figure 3:
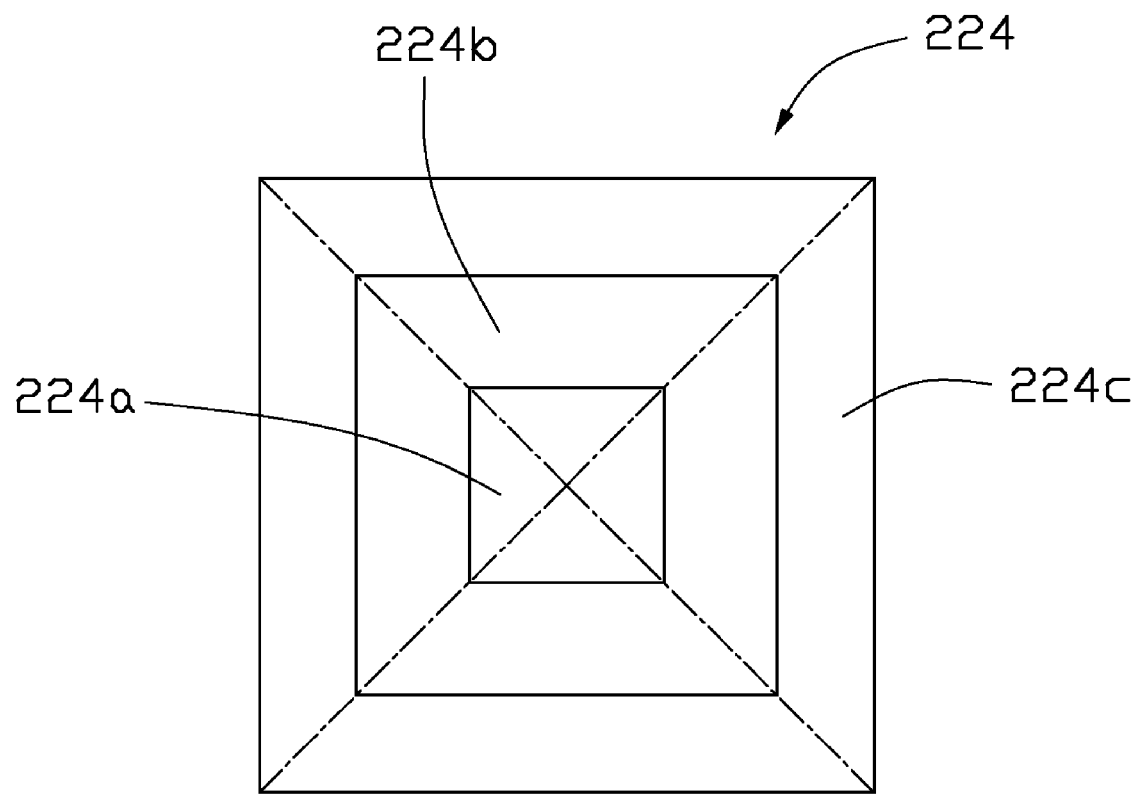
FIG. 3 is a schematic view of another embodiment of a light-converted component of the light source module of FIG. 1.

Referring to FIG. 3, another embodiment of a fluorescence material layer 224 is divided, for exemplary purposes, into a first region 224a, a second region 224b and a third region 224c. The fluorescence material layer 224 is similar to the fluorescence material layer 124 of FIG. 2, except that the shapes of the boundaries between the regions are rectangular shaped and surround the center of the layer 224.

The central region corresponds to a central portion of the array of the LEDs 13. Light emitted from the LEDs 13 passes through the fluorescence material layer 124 and strikes the fluorescence material to generate secondary color lights. The secondary color lights mix with residual initial lights to create white lights.

The light-converted component 12 may be made of the transparent substrate 122. The fluorescence materials are coated on a surface of the transparent substrate 122 to form the fluorescence material layer 124. The fluorescence material with concentration α1 is coated on the first region 124a. The fluorescence material with concentration α2 is coated on the second region 124b. The fluorescence material with concentration α3 is coated on the third region 124c.

The fluorescence materials may be a transparent gel doped with a plurality of fluorescence particles. The fluorescence materials may be coated on the transparent substrate 122 by a sputtering method or a printing method. The fluorescence particles are capable of fluorescing in yellow lights. A material of the fluorescence particles may be yttrium aluminum garnet ($Y_3Al_5O_{12}:Ce^{3+}$, YAG:Ce), nitride, or silicate.

The transparent substrate 122 may be made of glass, polycarbonate, polymethyl methacrylate (PMMA), silicone, or epoxy resin. Preferably, the transparent substrate 122 is doped with a plurality of diffusing particles capable of diffusing the white lights. A material of the diffusing particles may be polycarbonate, PMMA, fused silica, fused quartz, alumina ($Al_2O_3$), magnesia (MgO), titania ($TiO_2$), calcium fluoride ($CaF_2$), silica ($SiO_2$), calcium carbonate ($CaCO_3$), or barium sulfate ($BaSO_4$).

The intensity of the initial lights emitted from the array of the LEDs 13 gradually weakens from the center to the periphery of the array. In the first embodiment, the distribution of the concentration of the fluorescence materials corresponds to the intensity of the initial lights emitted from the array of the LEDs 13. Thus, the white lights emitted from the light source module 10 are evenly distributed.

Figure 4:
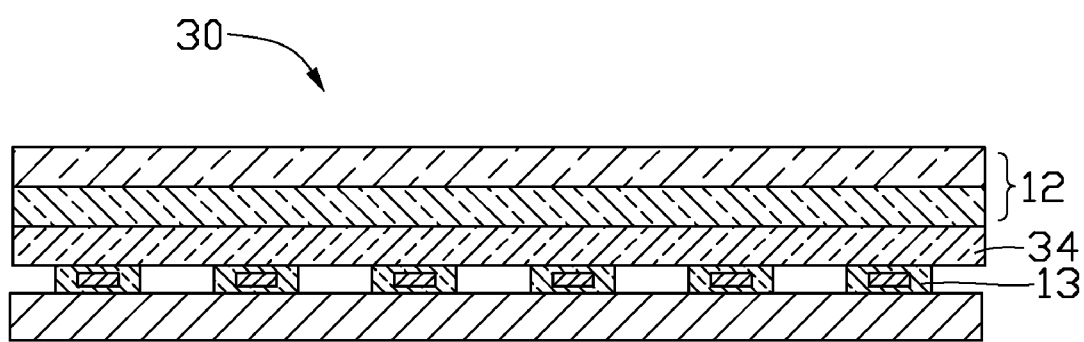
FIG. 4 is a cross-sectional view of a second embodiment of a light source module of LED.

Referring to FIG. 4, a second embodiment of a light source module 30 is similar to the light source module 10 of FIG. 1 except that the light source module 30 further includes an auxiliary light-converted component 34. The auxiliary light-converted component 34 is positioned between the light-converted component 12 and the array of the LEDs 13. Fluorescence material is distributed in the auxiliary light-converted component 34. The auxiliary light-converted component 34 is capable of fluorescing in red lights.

The LEDs 13 are packaged blue LEDs configured for emitting blue lights. Fluorescence material coated on the light-converted component 12 may fluoresce in yellow lights. Red lights fluoresced from the auxiliary light-converted component 34 combined with the yellow lights and the residual blue lights may improve the color rendering index (CRI) of white lights emitted from the light source module 30 to an index value of 90 and above.

In another embodiment, the fluorescence material coated on the light-converted component 12 may be configured for fluorescing in green lights. CRI of white lights produced by the green lights, the red lights and the residual blue lights may achieve an index value of 90 and above, and a color saturation of about 85%.

Figure 5:
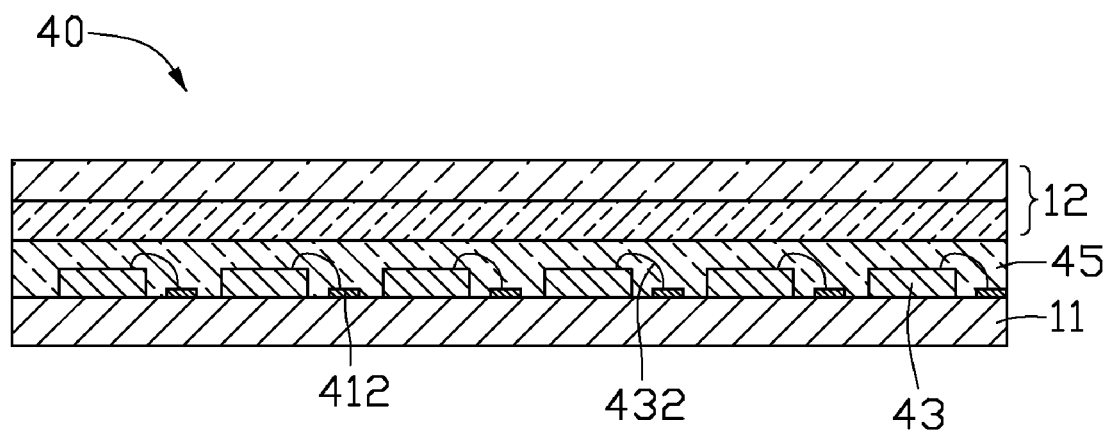
FIG. 5 is a cross-sectional view of a third embodiment of a light source module.

Referring to FIG. 5, a third embodiment of a light source module 40 is similar to the light source module 10 of FIG. 1 except that the light source module 40 includes a plurality of LED chips 43 and a transparent packing layer 45 that packages the LED chips. The LED chips 43 form an array and are positioned on a substrate 11 between the substrate 11 and a light-converted component 12. The transparent packaging layer 45 is positioned between the substrate 11 and the light-converted component 12. A material of the transparent packaging layer 45 may be silica gel or epoxy resin. The refractive index of the transparent packaging layer 45 is greater than or equal to the refractive index of the light-converted component 12.

Each LED chip 43 includes a conducting wire 432 electrically connected to an electrode sheet 412 positioned on the substrate 11. Each LED chip 43 and each electrode sheet 412 are electrically connected to the metal circuits of the substrate 11. The connecting wires 432 may be gold wires.

Figure 6:
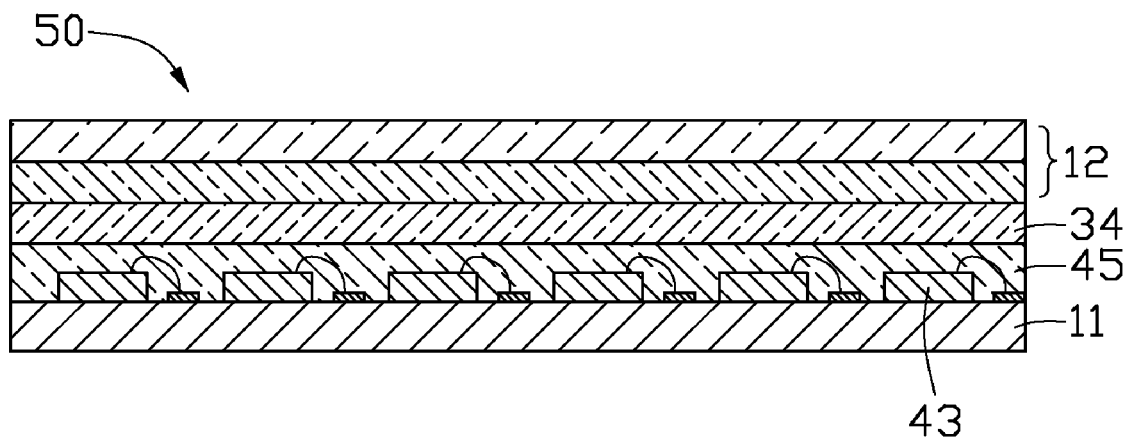
FIG. 6 is a cross-sectional view of a fourth embodiment of a light source module.

Referring to FIG. 6, a fourth embodiment of a light source module 50 is similar to the light source module 40 of FIG. 5, except that the light source module 50 further includes the auxiliary light-converted component 34 of FIG. 4. The auxiliary light-converted component 34 is positioned between the light-converted component 12 and the transparent packaging layer 45. Fluorescence material distributed in the auxiliary light-converted component 34 is configured for fluorescing in red lights.

A plurality of LED chips 43 are configured for emitting blue lights and the fluorescence material coated on the light-converted component 12 is configured for fluorescing in yellow lights or green lights.

It is believed that the present embodiments and their advantages will be understood from the foregoing description, and it will be apparent that various changes may be made thereto without departing from the spirit and scope of the invention or sacrificing all of its material advantages, the examples here before described merely being preferred or exemplary embodiments of the invention.

What is claimed is:

1. A light source module comprising:
   a substrate having circuits;
   a light-converted component comprising a transparent substrate and a fluorescence material layer being coated on the transparent substrate, wherein the fluorescence material layer defines a central region and a plurality of surrounding regions surrounding the central region; the central region has a greatest concentration of fluorescence material; concentrations of fluorescence material in the plurality of surrounding regions decreases from the center to the outer periphery of the fluorescence material layer; and
   a plurality of light emitting diodes forming an array and being positioned between the substrate and the fluorescence material layer, wherein each of the light emitting diodes is electrically connected to the circuits.

2. The light source module of claim 1, wherein boundaries between the plurality of surrounding regions are circular in shape and surround the central region.

3. The light source module of claim 1, wherein boundaries between the plurality of surrounding regions are rectangular in shape and surround the central region.

4. The light source module of claim 1, wherein the fluorescence material layer defines a first region, a second region surrounding the first region, and a third region surrounding the second region.

5. The light source module of claim 1, wherein the central region corresponds to a central portion of the array.

6. The light source module of claim 1, further comprising an auxiliary light-converted component positioned between the light-converted component and the array of the light emitting diodes, wherein the auxiliary light-converted component comprises fluorescence material configured for fluorescing in red lights.

7. The light source module of claim 6, wherein the fluorescence material layer is configured for fluorescing in green lights.

8. The light source module of claim 1, wherein each of the light emitting diodes is configured for emitting blue lights.

9. The light source module of claim 1, wherein the fluorescence material layer is configured for fluorescing in yellow lights.

10. The light source module of claim 1, wherein the substrate comprises a printed circuit board.

11. The light source module of claim 1, wherein each of light emitting diodes includes a light emitting diode chip and a packaging component packaging the light emitting diode chip.

12. The light source module of claim 11, wherein the substrate comprises electrode sheets positioned on the substrate; each of the light emitting diode chips comprises a conducting wire electrically connected to an electrode sheet; each of the light emitting diode chips and each of the electrode sheets are electrically connected to the circuits.

13. A light source module, comprising:
a substrate having circuits;
a light-converted component comprising a transparent substrate and a fluorescence material layer being coated on the transparent substrate, wherein the fluorescence material layer defines a central region and a plurality of surrounding regions surrounding the central region; the central region has a greatest concentration of fluorescence material; concentration of fluorescence material in the plurality of surrounding regions decreases from the center to the outer periphery of the fluorescence material layer;
a plurality of light emitting diode chips forming an array and being positioned on the substrate, wherein each of the light emitting diode chips is electrically connected to the circuits; and
a transparent packaging layer positioned between the substrate and the fluorescence material layer, and packaging the light emitting diode chips.

14. The light source module of claim 13, further comprising an auxiliary light-converted component positioned between the light-converted component and the array; wherein the auxiliary light-converted component comprises fluorescence material configured for fluorescing in red lights.

15. The light source module of claim 14, wherein the fluorescence material layer is configured for fluorescing in green lights.

16. The light source module of claim 13, wherein each of the light emitting diodes is configured for emitting blue lights.

17. The light source module of claim 13, wherein the fluorescence material layer is configured for fluorescing in yellow lights.

18. A light-converted component for a light source module, comprising:
a transparent substrate, and
a fluorescence material layer coated on the transparent substrate, wherein the fluorescence material layer defines a central region and a plurality of surrounding regions surrounding the central region; the central region has a greatest concentration of fluorescence material; concentration of fluorescence material in the plurality of surrounding regions decreases from the center to the outer periphery of the fluorescence material layer.

19. The light-converted component of claim 18, wherein boundaries between the plurality of surrounding regions are circular in shape and surround the central region.

20. The light-converted component of claim 18, wherein boundaries between the plurality of surrounding regions are rectangular in shape and surround the central region.

* * * * *